(12) United States Patent
Yu et al.

(10) Patent No.: US 11,410,873 B2
(45) Date of Patent: Aug. 9, 2022

(54) DEEP TRENCH INTEGRATION PROCESSES AND DEVICES

(71) Applicant: Applied Materials, Inc., Santa Clara, CA (US)

(72) Inventors: Lan Yu, Albany, NY (US); Tyler Sherwood, Fonda, NY (US); Michael Chudzik, Mountain View, CA (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/953,567

(22) Filed: Nov. 20, 2020

(65) Prior Publication Data

US 2022/0165610 A1 May 26, 2022

(51) Int. Cl.
*H01L 29/00* (2006.01)
*H01L 29/94* (2006.01)
*H01L 31/062* (2012.01)
*H01L 21/768* (2006.01)
*H01L 29/06* (2006.01)
*H01L 21/762* (2006.01)

(52) U.S. Cl.
CPC .. *H01L 21/76802* (2013.01); *H01L 21/76224* (2013.01); *H01L 29/0649* (2013.01)

(58) Field of Classification Search
CPC ......... H01L 21/76898; H01L 21/76224; H01L 29/0649; H01L 21/76229; H01L 21/76831; H01L 29/407; H01L 21/76232; H01L 21/762; H01L 21/76205; H01L 21/764; H01L 21/76837; H01L 21/76802
USPC ...................................................... 257/508
See application file for complete search history.

(56) References Cited

U.S. PATENT DOCUMENTS

| 6,207,532 B1 | 3/2001 | Lin et al. |
| 2006/0263991 A1 | 11/2006 | Lee et al. |
| 2007/0284692 A1* | 12/2007 | Lee .................. H01L 21/76232 257/510 |
| 2010/0197109 A1 | 8/2010 | Jeong et al. |
| 2012/0104564 A1* | 5/2012 | Won .................... H01L 29/0649 257/622 |

(Continued)

FOREIGN PATENT DOCUMENTS

| KR | 2005-0028618 A | 3/2005 |
| KR | 10-1379508 B1 | 3/2014 |

OTHER PUBLICATIONS

International Search Report and Written Opinion dated Mar. 10, 2022 in International Patent Application No. PCT/US2021/059728, 7 pages.

*Primary Examiner* — Theresa T Doan
(74) *Attorney, Agent, or Firm* — Kilpatrick Townsend & Stockton LLP

(57) ABSTRACT

Exemplary methods of forming a semiconductor device may include etching a trench from a first surface of a semiconductor substrate to a first depth within the semiconductor substrate. The trench may be characterized by a first width through the first depth. The methods may include forming a liner along sidewalls of the trench. The methods may include etching the trench to a second depth at least ten times greater than the first depth. The trench may be characterized by a second width through the second depth. The methods may include filling the trench with a dielectric material. A seam formed in the dielectric material may be maintained below the first depth.

20 Claims, 4 Drawing Sheets

(56) References Cited

U.S. PATENT DOCUMENTS

2017/0170290 A1\* 6/2017 Basker .............. H01L 21/76897
2019/0259651 A1\* 8/2019 Lillibridge .......... H01L 29/0649

\* cited by examiner

DEEP TRENCH INTEGRATION PROCESSES AND DEVICES

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

Exemplary methods of forming a semiconductor device may include etching a trench from a first surface of a semiconductor substrate to a first depth within the semiconductor substrate. The trench may be characterized by a first width through the first depth. The methods may include forming a liner along sidewalls of the trench. The methods may include etching the trench to a second depth at least ten times greater than the first depth. The trench may be characterized by a second width through the second depth. The methods may include filling the trench with a dielectric material. A seam formed in the dielectric material may be maintained below the first depth.

In some embodiments, the methods may include patterning a hardmask overlying the semiconductor substrate to produce a recess characterized by the first width across the first surface of the semiconductor substrate. The methods may include performing a chemical-mechanical polishing operation to remove the dielectric material from the first surface of the semiconductor substrate. The seam may not be exposed during the chemical-mechanical polishing operation. The semiconductor substrate may be or include silicon. The dielectric material may be or include silicon oxide. The liner may be formed conformally along exposed portions of the semiconductor substrate. The method may include etching the liner from a base of the trench at the first depth. The first width may be less than or about 40% greater than the second width. The first depth may be less than or about 10% of a depth through the trench from the first surface of the semiconductor substrate to a base of the trench at the second depth.

Some embodiments of the present technology may encompass methods of forming a semiconductor device. The methods may include patterning an opening in a mask material overlying a first surface of a semiconductor substrate. The methods may include etching a trench from the first surface of the semiconductor substrate to a first depth within the semiconductor substrate. The trench may be characterized by a first width through the first depth. The methods may include forming a liner across the semiconductor substrate and mask material, including along sidewalls of the trench. The methods may include performing an anisotropic removal of the liner. The methods may include etching the trench to a second depth. The trench may be characterized by a second width through the second depth. The methods may include filling the trench with a dielectric material. A seam formed in the dielectric material may be maintained below the first depth.

In some embodiments, the liner may be characterized by a thickness that is half a difference between the first width and the second width. The methods may include performing a chemical-mechanical polishing operation to remove the dielectric material from the first surface of the semiconductor substrate. The seam may not be exposed during the chemical-mechanical polishing operation. The semiconductor substrate may be or include silicon. The dielectric material may be or include silicon oxide. The trench may be characterized by a depth-to-width aspect ratio of greater than or about 30. The first width may be less than or about 40% greater than the second width. The first depth may be less than or about 10% of a depth through the trench from the first surface of the semiconductor substrate to a base of the trench at the second depth.

Some embodiments of the present technology may encompass methods of forming a semiconductor device. The methods may include etching a trench from a first surface of a semiconductor substrate to a first depth within the semiconductor substrate. The trench may be characterized by a first width through the first depth. The methods may include forming a liner across the semiconductor substrate, including along sidewalls of the trench. The methods may include performing an anisotropic removal of the liner. The methods may include etching the trench to a second depth. The trench may be characterized by a second width through the second depth. The methods may include filling the trench with a dielectric material. A seam formed in the dielectric material may be maintained below the first depth. In some embodiments, the methods may include performing a chemical-mechanical polishing operation to remove the dielectric material from the first surface of the semiconductor substrate. The seam may not be exposed during the chemical-mechanical polishing operation.

Such technology may provide numerous benefits over conventional systems and techniques. For example, the processes may produce devices in which a seam may not be exposed during polishing operations. Additionally, the processes may provide a self-aligned trench formation in which only a single patterning operation may be performed on a mask material. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
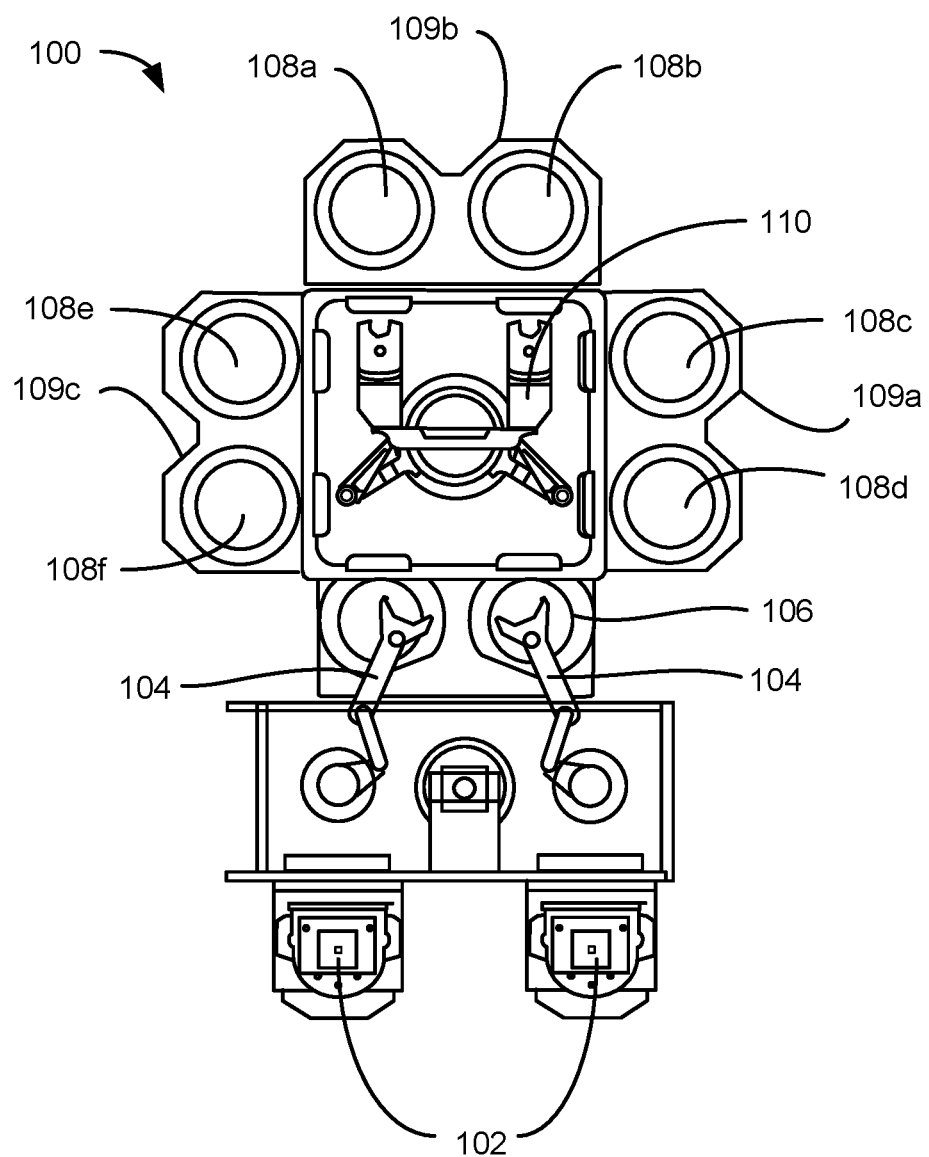
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, uniformity, material quality, process control, and repeatability are becoming more challenging from process to process. To continue to improve device performance at reduced scale, alternative films and processes are being investigated for additional performance improvements relative to conventional devices.

For example, in power devices, including power diodes, many structures are formed over silicon carbide or gallium nitride, which may be prohibitively expensive. However, to use alternative materials, such as silicon, as a device substrate for high-power devices including at or above 650 V, charge balancing becomes more difficult to achieve between various regions of the device. Additionally, power diodes may be characterized by a deep trench formed to facilitate charge balancing between n-semiconductor materials and p-semiconductor materials of the device. To improve device scaling, a thin layer of highly p-type charged material may be used to balance the n-type charge of the silicon, which allows a reduction in the dimension of p-region materials.

During formation operations for some power devices, a trench may be formed through the substrate, which may be a high-aspect-ratio trench. The trench may be lined with one or more materials, and may be filled with a dielectric material. Because of the dimensions of some of these trenches, a seam may form in the dielectric material during the fill operation. Because of characteristics of the deposition process, the seam may extend up to or towards the top of the trench before being pinched off by deposited material. Subsequent processing may include chemical-mechanical polishing to remove excess dielectric material across the substrate, and expose the substrate or material in which the trench is formed. Because the seam may extend within a few hundred nanometers of the top of the trench, the polishing operation may expose the seam in conventional processing. This may allow polishing fluids and materials to be pulled within the seam and into the trench, which may contaminate the structure.

The present technology may overcome these issues by forming a semiconductor device including a deep trench having multiple widths. By increasing trench width at the top of the trench, seam formation may be recessed deeper within the trench. Accordingly, during subsequent polishing, the seam may not be exposed. Although the remaining disclosure will routinely identify specific structures, such as diodes, for which the present structures and methods may be employed, it will be readily understood that the systems and methods are equally applicable to any number of structures and devices that may benefit from the formation of a trench, recess, or feature on a semiconductor substrate. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
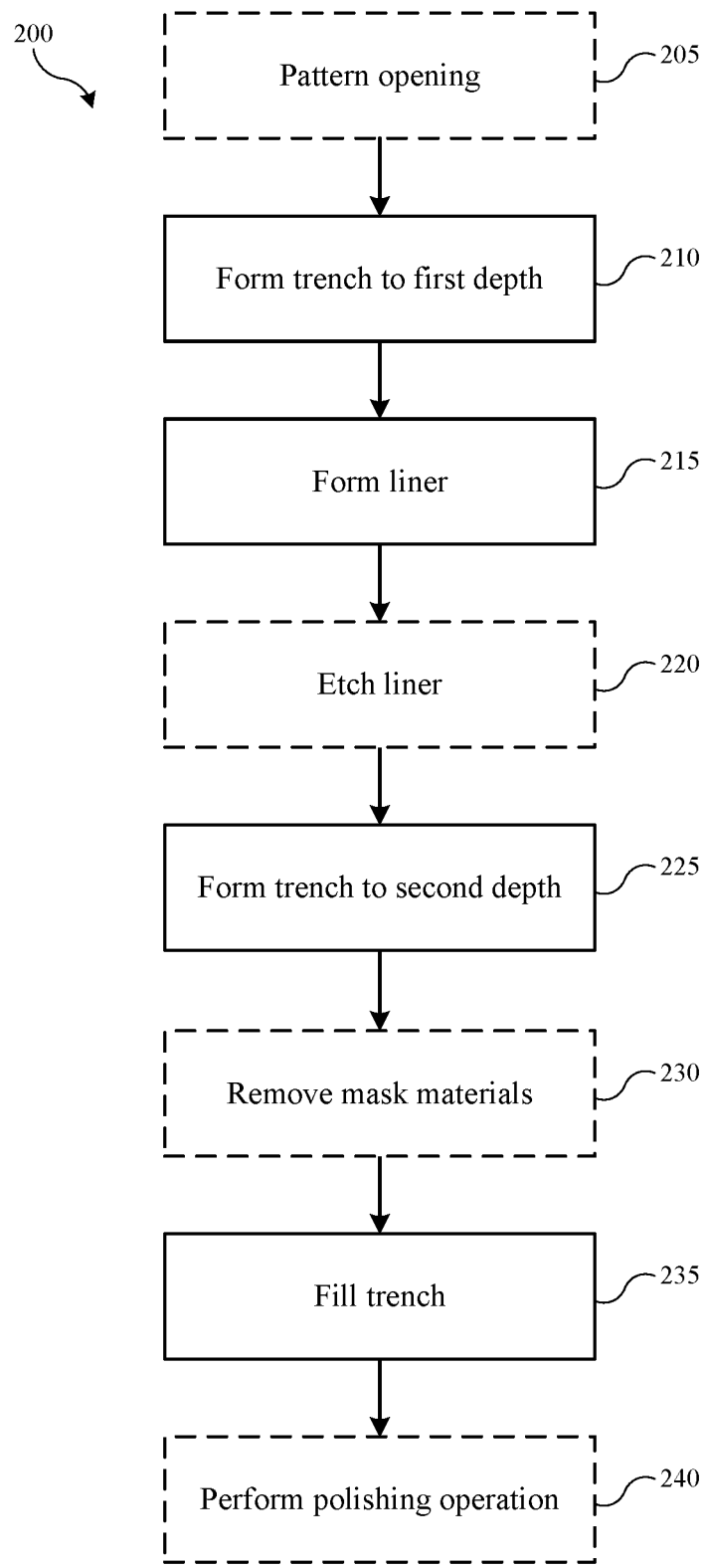
FIG. 2 shows exemplary operations in a method of forming semiconductor devices according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor device according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3G, the illustrations of which will be described in conjunction with the operations of method 200. It is to be understood that FIG. 3 illustrates only partial schematic views with limited details, and in some embodiments a substrate may contain any number of semiconductor sections having aspects as illustrated in the figures, as well as alternative structural aspects that may still benefit from any of the aspects of the present technology.

Figure 3A:
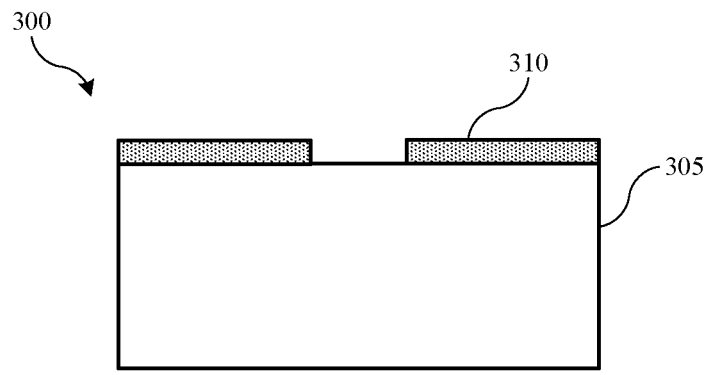
FIGS. 3A-3G show cross-sectional views of substrates being processed according to some embodiments of the present technology.

Method 200 may involve optional operations to develop the semiconductor structure to a particular fabrication operation. Although in some embodiments method 200 may be performed on a base structure, in some embodiments the method may be performed subsequent other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure. In some embodiments, substrate 305 may be or include silicon, which may be doped by any number of materials, as well as silicon-containing or gallium-containing materials.

One or more material layers may be formed over some or all of substrate 305. For example, in some embodiments a mask material 310 may optionally be formed overlying substrate 305. The mask material 310 may be any number of materials that may be etched or processed selectively with respect to the substrate 305. In one non-limiting example in which the substrate may be silicon, the mask material may be silicon oxide, although any other mask material may similarly be used. The mask material may be patterned at optional operation 205, which may produce one or more access positions across the substrate, such as where a trench may be formed. Although illustrated as a single instance, it is to be understood that any number of sections of substrate 305 may be exposed to form any number of devices or structures. Substrate 305, which may include mask material 310, may be housed or positioned in a processing region of a semiconductor processing chamber, and method 200 may be performed to form a semiconductor device structure.

Figure 3B:
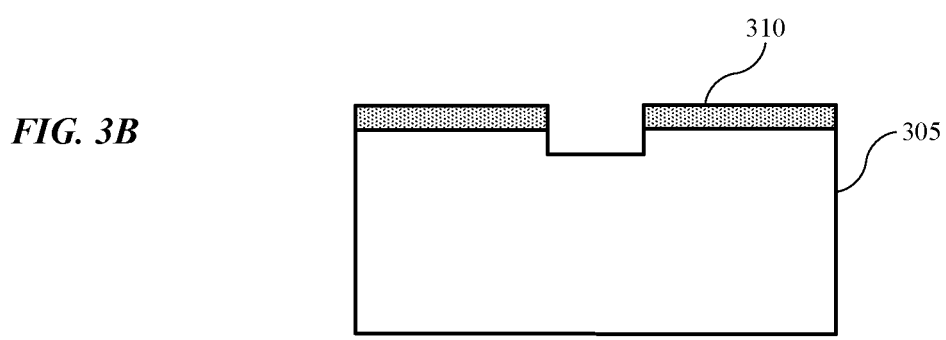

Method 200 may include etching or otherwise forming a trench to a first depth within the substrate at operation 210. As shown in FIG. 3B, the process may recess the substrate 305 at the portions exposed through mask material 310. The etch process may be a reactive-ion etch, a plasma etch, or any other process that may selectively etch material from substrate 305 relative to mask material 310. The trench may be formed at a first width through the first depth, which may be defined by patterning of the mask material. In some embodiments, the first width may be greater than a target width of the trench, which may facilitate a fill operation as will be described below. For example, in some embodiments, the first width may be greater than or about 5% greater than a target width of the trench, and may be greater than or about 10% greater than a target width of the trench, greater than or about 15% greater than a target width of the trench, greater than or about 20% greater than a target width of the trench, greater than or about 25% greater than a target width of the trench, greater than or about 30% greater than a target width of the trench, greater than or about 35% greater than a target width of the trench, greater than or about 40% greater than a target width of the trench, greater than or about 45% greater than a target width of the trench, greater than or about 50% greater than a target width of the trench, or greater. However, when the first width is formed much greater than the target width, the first width of the trench may not facilitate pattern fill, as will be described further below. Accordingly, in some embodiments the first width may be less than or about 70% greater than a target width of the trench, and may be less than or about 60% greater than a target width of the trench, less than or about 50% greater than a target width of the trench, or less.

The first depth may be formed at a depth to limit pinch off proximate the surface of the semiconductor substrate. For example, the first depth may be formed greater than or about 100 nm from the substrate surface, and may be formed to a depth of greater than or about 200 nm, greater than or about 500 nm, greater than or about 750 nm, greater than or about 1.0 µm, greater than or about 1.5 µm, greater than or about 2.0 µm, greater than or about 2.5 µm, greater than or about 3.0 µm, or greater. However, when the depth exceeds a certain amount, pinch off may be detrimentally facilitated towards the surface of the substrate as the deposition fill may accommodate the associated trench structure. Accordingly, in some embodiments, the first depth may be less than or about 3.5 µm, less than or about 3.0 µm, less than or about 2.5 µm, less than or about 2.0 µm, or less. Additionally, the first depth may be less than or about 25% of a total depth through the trench from the first surface of the substrate, and may be less than or about 20% of a total depth through the trench, less than or about 15% of a total depth through the trench, less than or about 10% of a total depth through the trench, less than or about 5% of a total depth through the trench, less than or about 1% of a total depth through the trench, or less. However, if the first depth is sufficiently proximate the first surface of the substrate, pinch off may occur closer to the surface of the substrate. Accordingly, the first depth may be greater than or about 0.1% of a total depth through the trench, and may be greater than or about 0.25% of a total depth through the trench, greater than or about 0.50% of a total depth through the trench, greater than or about 1.0% of a total depth through the trench, or more.

Figure 3C:
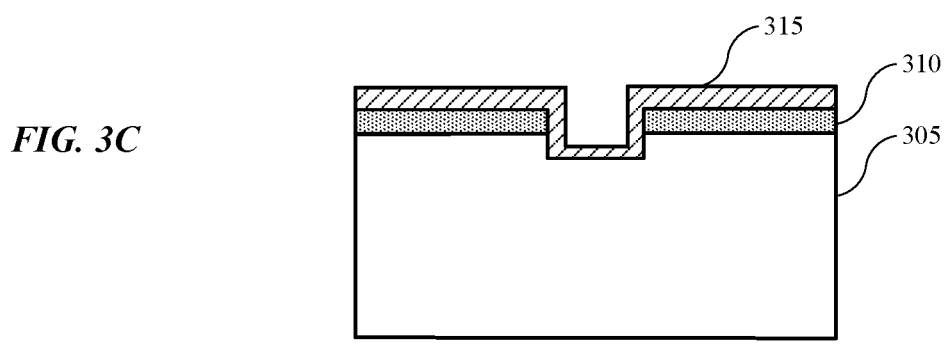

Subsequent the first etch process, a liner may be deposited across the substrate at operation 215. As illustrated in FIG. 3C, liner 315 may be formed across the substrate, and may extend across the materials on the substrate. Liner 315 may be a conformal liner, which may conformally extend across the mask material 310, sidewalls of the trench, and a base of the trench in substrate 305. The liner 315 may be any number of materials, and may be the same or different materials from any other material. For example, liner 315 may be another dielectric material, which may facilitate a subsequent etch operation. In some embodiments, liner 315 may be the same material as mask material 310, and may be formed in a similar or different way as mask material 310. For example, while mask material 310 may be formed by a more blanket deposition, liner 315 may be formed by atomic-layer deposition, thermal deposition, plasma-enhanced deposition, or any other process that may produce a conformal liner across the substrate, and within the feature formed as the first portion of the trench.

Figure 3D:
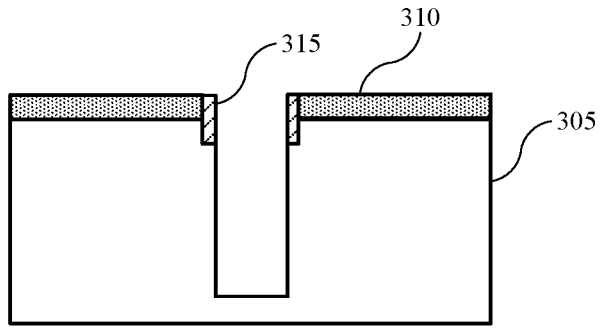

Method 200 may include performing a recess of the liner at optional operation 220. The liner may be etched anisotropically to remove the liner from planar regions of the substrate. As illustrated in FIG. 3D, liner 315 may be removed from across the top or planar surface of the mask material 310, and may also be removed from the bottom of the trench at the first depth on substrate 305. Consequently, liner 315 may remain along sidewalls of the mask material 310 and the substrate 305 within the first portion of the trench. This residual liner material may facilitate definition of the trench at the target width. As explained previously, the trench may be formed at a first width to a first depth within the substrate 305, prior to forming the rest of the trench at a second target width, which may be less than the first width. The second width of the trench may extend to the target depth of the trench, the second width of which may be defined by the liner 315 along the sidewalls of the trench at the first depth. Accordingly, in some embodiments, because the liner will be formed on each side of the trench, the liner may be formed at a thickness that is half the difference between the first width of the trench and a target width of the trench.

A second etch process may then be performed to extend the trench through the substrate at operation 225, and which may form the trench to a final depth through the substrate 305. As illustrated in FIG. 3D, the second depth of the trench may be formed to a greater depth than the first depth, and may be formed to a depth that is greater than or about two times greater than the first depth, greater than or about five times greater than the first depth, greater than or about ten times greater than the first depth, greater than or about fifteen times greater than the first depth, greater than or about twenty times greater than the first depth, greater than or about twenty-five times greater than the first depth, greater than or about thirty times greater than the first depth, greater than or about thirty-five times greater than the first depth, greater than or about forty times greater than the first depth, greater than or about forty-five times greater than the first depth, greater than or about fifty times greater than the first depth, or more. This may produce a trench characterized by an overall depth that may be greater than or about 40 µm, 50 µm, 60 µm, or more, and which may be characterized by a depth-to-width aspect ratio of greater than or about 20, greater than or about 25, greater than or about 30, greater than or about 35, greater than or about 40, greater than or about 45, greater than or about 50, or more.

Accordingly, the second width of the trench may be less than or about 5 µm, less than or about 4 µm, less than or about 3 µm, less than or about 2 µm, less than or about 1 µm, or less. Additionally, to produce this second width, the liner material may be conformally formed to a thickness of less than or about 500 nm, and may be formed to a thickness of less than or about 400 nm, less than or about 300 nm, less than or about 200 nm, less than or about 100 nm, less than or about 50 nm, less than or about 20 nm, or less. However, if the first width is close to or substantially similar to the second width, pinch off may still occur near the top of the trench as explained above. Accordingly, in some embodiments the liner may be formed to a thickness of greater than or about 50 nm, greater than or about 100 nm, greater than or about 200 nm, or more.

Advantageously, the present technology may produce a trench characterized by a double width utilizing only a single patterning operation. For example, once mask material 310 is initially patterned to the first width, a second patterning operation may not be performed as the liner may operate as an extension of the mask. Because of the formation of the liner along the trench formed at the first depth, the process may be self-aligned in that the second substrate etch may occur without any additional locating or masking operations. This may be performed due to the conformal coverage of the liner, and the anisotropic removal of the liner, which may reduce the width of the trench from the first width to the second width with a single liner deposition, and anisotropic liner removal.

Figure 3E:
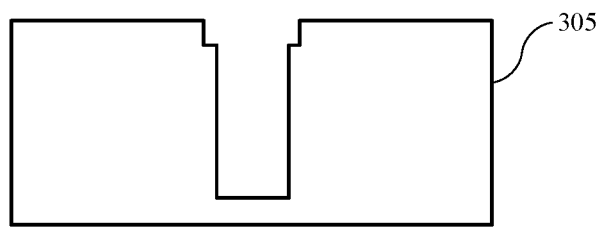
Figure 3F:
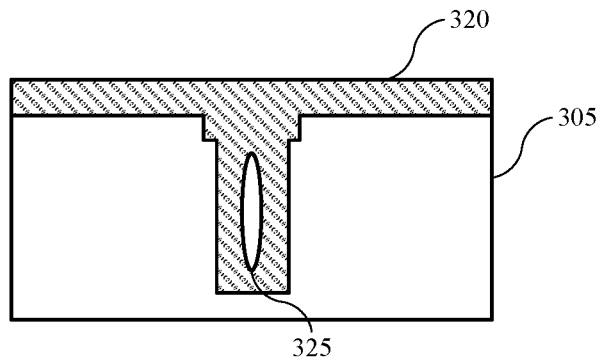

At optional operation 230, the mask materials 310 and the residual material from liner 315 may be removed from the substrate 305, leaving a recessed ledge formed at the first depth of the trench, as illustrated in FIG. 3E. The width of the ledge may be similar or equal to the thickness of deposition or formation of the liner. As explained previously, the mask material and the liner may be the same material in some embodiments, and thus a single removal operation may be performed to remove both materials. Any selective removal operations may be performed to remove the mask materials from the substrate materials, which may maintain the trench structure during the removal. One or more additional operations may be performed in embodiments of the present technology. For example, one or more liners, n-materials, or p-materials may be formed along the substrate or the trench. At operation 235, a material may be deposited in the trench. As shown in FIG. 3F, the material 320 may be deposited to fill the trench and form an amount of overlying material. The material may be any material for any number of semiconductor structures, and in some embodiments may be a dielectric material. Because of the depth and width of the trench, flowable depositions may be challenged or time consuming. Accordingly, a deposition, which may be a plasma-enhanced deposition, may be used that causes a seam 325 to form within the trench.

Figure 3G:
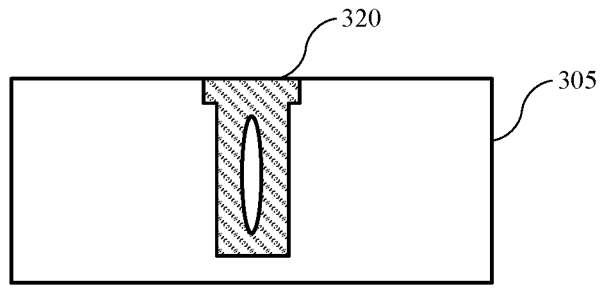

As explained above, conventional technologies may be incapable of producing a seam that forms below an initial depth within the trench. This may cause a subsequent polishing operation that removes a top layer of the deposited material to expose the seam, which may cause contamination of the structure from ingress of the polishing chemicals. By forming the recessed ledge within the trench as previously explained, the seam may be driven further into the structure, to ensure the seam is not exposed during subsequent polishing operations. In some embodiments, the seam may be maintained below the surface of the substrate. An optional polishing operation 240 may be performed to remove residual material 320 from the substrate surface, which may expose the surface of the substrate 305, as illustrated in FIG. 3G.

The present technology may force the seam a minimum distance from a surface of the substrate by forming the double-width trench formation. For example, in some embodiments, the seam may be recessed a depth greater than or about 200 nm from the surface of the substrate, and may be recessed a depth greater than or about 300 nm from the surface of the substrate, a depth greater than or about 400 nm from the surface of the substrate, a depth greater than or about 500 nm from the surface of the substrate, a depth greater than or about 600 nm from the surface of the substrate, a depth greater than or about 700 nm from the surface of the substrate, a depth greater than or about 800 nm from the surface of the substrate, a depth greater than or about 900 nm from the surface of the substrate, a depth greater than or about 1.0 µm from the surface of the substrate, or more.

Limiting the seam to a depth as stated may be based on control of the first depth and the first width of the trench formation. For example, if the first width is excessively large relative to the second trench width, the first trench may no longer effectively operate as part of the trench during deposition, and pinch off and planarization operations may produce the seam above or along the surface of the substrate because over-deposition of the material within the larger first region may limit an effect on the material deposited. Additionally, an overly large first width or depth may impact the device being formed by failing to maintain critical dimensions of the structure. Similarly, if the first width is substantially similar to the second width, the deposition throughout the trench may not be sufficiently affected by the ledge, and pinch off may still occur closer to or above the substrate surface, which may expose the seam during planarization. However, when the ledge is produced at a width and depth according to some embodiments of the present technology, deposition between the surface corners of the trench may be controlled, while the second depth of the trench is being filled. Accordingly, pinch-off within the trench may be limited to within the second section of the trench, or at least a distance beneath the surface of the substrate so the seam may not be exposed during chemical-mechanical polishing. Consequently, the present technology may produce deep trench formation and deposition with a single patterning operation, while also forcing a seam formation further within the trench beneath the surface of a substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a ledge" includes a plurality of such ledges, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor device, the method comprising:
   etching a trench from a first surface of a semiconductor substrate to a first depth within the semiconductor substrate, wherein the trench is characterized by a first width through the first depth;
   forming a liner along sidewalls of the trench;
   etching the trench to a second depth at least ten times greater than the first depth, wherein the trench is characterized by a second width through the second depth; and
   filling the trench with a dielectric material, wherein a seam formed in the dielectric material is maintained below the first depth.

2. The method of forming a semiconductor device of claim 1, further comprising:
   patterning a hardmask overlying the semiconductor substrate to produce a recess characterized by the first width across the first surface of the semiconductor substrate.

3. The method of forming a semiconductor device of claim 1, further comprising:
   performing a chemical-mechanical polishing operation to remove the dielectric material from the first surface of the semiconductor substrate.

4. The method of forming a semiconductor device of claim 3, wherein the seam is not exposed during the chemical-mechanical polishing operation.

5. The method of forming a semiconductor device of claim 1, wherein the semiconductor substrate comprises silicon.

6. The method of forming a semiconductor device of claim 1, wherein the dielectric material comprises silicon oxide.

7. The method of forming a semiconductor device of claim 1, wherein the liner is formed conformally along exposed portions of the semiconductor substrate, the method further comprising:
   etching the liner from a base of the trench at the first depth.

8. The method of forming a semiconductor device of claim 1, wherein the first width is less than or about 40% greater than the second width.

9. The method of forming a semiconductor device of claim 1, wherein the first depth is less than or about 10% of a depth through the trench from the first surface of the semiconductor substrate to a base of the trench at the second depth.

10. A method of forming a semiconductor device, the method comprising:
    patterning an opening in a mask material overlying a first surface of a semiconductor substrate;
    etching a trench from the first surface of the semiconductor substrate to a first depth within the semiconductor substrate, wherein the trench is characterized by a first width through the first depth;
    forming a liner across the semiconductor substrate and mask material, including along sidewalls of the trench;
    performing an anisotropic removal of the liner;
    etching the trench to a second depth, wherein the trench is characterized by a second width through the second depth; and
    filling the trench with a dielectric material, wherein a seam formed in the dielectric material is maintained below the first depth.

11. The method of forming a semiconductor device of claim 10, wherein the liner is characterized by a thickness that is half a difference between the first width and the second width.

12. The method of forming a semiconductor device of claim 10, further comprising:
performing a chemical-mechanical polishing operation to remove the dielectric material from the first surface of the semiconductor substrate.

13. The method of forming a semiconductor device of claim 12, wherein the seam is not exposed during the chemical-mechanical polishing operation.

14. The method of forming a semiconductor device of claim 10, wherein the semiconductor substrate comprises silicon.

15. The method of forming a semiconductor device of claim 10, wherein the dielectric material comprises silicon oxide.

16. The method of forming a semiconductor device of claim 10, wherein the trench is characterized by a depth-to-width aspect ratio of greater than or about 30.

17. The method of forming a semiconductor device of claim 10, wherein the first width is less than or about 40% greater than the second width.

18. The method of forming a semiconductor device of claim 10, wherein the first depth is less than or about 10% of a depth through the trench from the first surface of the semiconductor substrate to a base of the trench at the second depth.

19. A method of forming a semiconductor device, the method comprising:
etching a trench from a first surface of a semiconductor substrate to a first depth within the semiconductor substrate, wherein the trench is characterized by a first width through the first depth;
forming a liner across the semiconductor substrate, including along sidewalls of the trench;
performing an anisotropic removal of the liner;
etching the trench to a second depth, wherein the trench is characterized by a second width through the second depth; and
filling the trench with a dielectric material, wherein a seam formed in the dielectric material is maintained below the first depth.

20. The method of forming a semiconductor device of claim 19, further comprising:
performing a chemical-mechanical polishing operation to remove the dielectric material from the first surface of the semiconductor substrate, wherein the seam is not exposed during the chemical-mechanical polishing operation.

* * * * *